United States Patent
Kogure et al.

(10) Patent No.: US 7,918,021 B2
(45) Date of Patent: Apr. 5, 2011

(54) PRODUCTION OF VIA HOLE IN A FLEXIBLE PRINTED CIRCUIT BOARD BY APPLYING A LASER OR PUNCH

(75) Inventors: Ryuichiro Kogure, Osaka (JP); Tadahiro Yokozawa, Chiba (JP); Hiroaki Yamaguchi, Chiba (JP); Osamu Nakayama, Kanagawa (JP)

(73) Assignee: Ube Industries, Ltd., Yamaguchi (JP)

( * ) Notice: Subject to any disclaimer, the term of this patent is extended or adjusted under 35 U.S.C. 154(b) by 49 days.

(21) Appl. No.: 12/169,850

(22) Filed: Jul. 9, 2008

(65) Prior Publication Data

US 2009/0002953 A1    Jan. 1, 2009

Related U.S. Application Data

(62) Division of application No. 10/512,204, filed on Oct. 22, 2004, now abandoned.

(30) Foreign Application Priority Data

Apr. 24, 2002   (JP) .................................. 2002-122256

(51) Int. Cl.
*H01K 3/10* (2006.01)
*H05K 7/20* (2006.01)

(52) U.S. Cl. ................ 29/852; 29/830; 29/831; 29/832; 29/825; 29/846; 361/720

(58) Field of Classification Search .................... 29/852, 29/846, 831, 832, 840, 847, 825, 829; 428/216, 428/209, 348; 174/254, 260, 262, 255; 427/97, 427/98, 97.7, 97.1; 361/720, 748, 751
See application file for complete search history.

(56) References Cited

U.S. PATENT DOCUMENTS

| | | | | |
|---|---|---|---|---|
| 5,243,144 A | * | 9/1993 | Ogino et al. | .................. 174/266 |
| 5,352,325 A | | 10/1994 | Kato | |
| 5,374,469 A | | 12/1994 | Hino et al. | |
| 5,436,062 A | * | 7/1995 | Schmidt et al. | ................ 428/209 |
| 5,525,204 A | | 6/1996 | Shurboff et al. | |
| 5,527,741 A | | 6/1996 | Cole et al. | |
| 5,837,154 A | | 11/1998 | Okabe et al. | |
| 6,054,761 A | | 4/2000 | McCormack et al. | |
| 6,117,706 A | | 9/2000 | Yoshioka et al. | |

(Continued)

FOREIGN PATENT DOCUMENTS

EP    0 969 707 A2    1/2000

(Continued)

OTHER PUBLICATIONS

Office Action dated Dec. 15, 2006 for Japanese Application No. JP-2002-122256 (non-English).

(Continued)

*Primary Examiner* — Derris H Banks
*Assistant Examiner* — Tai Nguyen
(74) *Attorney, Agent, or Firm* — Nixon Peabody LLP; Jeffrey L. Costellia

(57) ABSTRACT

A flexible circuit printable board can be favorably produced by a process composed of steps of forming in a polyimide film having a metal coat on each surface side a via hole penetrating at least one metal coat and the polyimide film; and applying a mixture of liquid and abrasive grains under pressure onto the via hole, whereby smoothing an edge of the via hole and cleaning the via hole.

6 Claims, 3 Drawing Sheets

U.S. PATENT DOCUMENTS

| | | | |
|---|---|---|---|
| 6,214,923 B1 * | 4/2001 | Goto et al. | 524/514 |
| 6,240,636 B1 * | 6/2001 | Asai et al. | 29/852 |
| 6,323,436 B1 | 11/2001 | Hedrick et al. | |
| 6,340,518 B1 | 1/2002 | Kitahara et al. | |
| 6,379,223 B1 | 4/2002 | Sun et al. | |
| 6,427,325 B1 | 8/2002 | Johansson et al. | |
| 6,449,835 B1 * | 9/2002 | Oura et al. | 29/830 |
| 6,486,394 B1 * | 11/2002 | Schmidt et al. | 174/36 |

FOREIGN PATENT DOCUMENTS

| | | |
|---|---|---|
| EP | 1 040 892 A1 | 10/2000 |
| EP | 1 102 525 A1 | 5/2001 |
| JP | 01-256194 | 10/1989 |
| JP | 09-295266 | 11/1997 |
| JP | 10-154730 | 6/1998 |
| JP | 2000-110747 | 4/2000 |
| JP | 2000-124583 | 4/2000 |
| JP | 2000-343435 | 12/2000 |
| JP | 2002-031889 | 1/2002 |
| JP | 2000-043753 | 2/2002 |
| JP | 2002-043753 | 2/2002 |
| JP | 2002-096437 | 4/2002 |
| JP | 2002-110747 | 4/2002 |

OTHER PUBLICATIONS

"Solder Mask Lamination" Research Disclosure, Kenneth Mason Publications, Hampshire, GB, No. 272, Dec. 1, 1986; p. 709.

"Fluidized Abrasive Hole—Cleaning Technique", IBM Technique Disclosure Bulletin, IBM Corp. New York, US, vol. 32, No. 8A, 1990, pp. 39-40.

International Search Report, PCT/JP 03/05289, Jul. 14, 2003.

* cited by examiner

F I G. 5
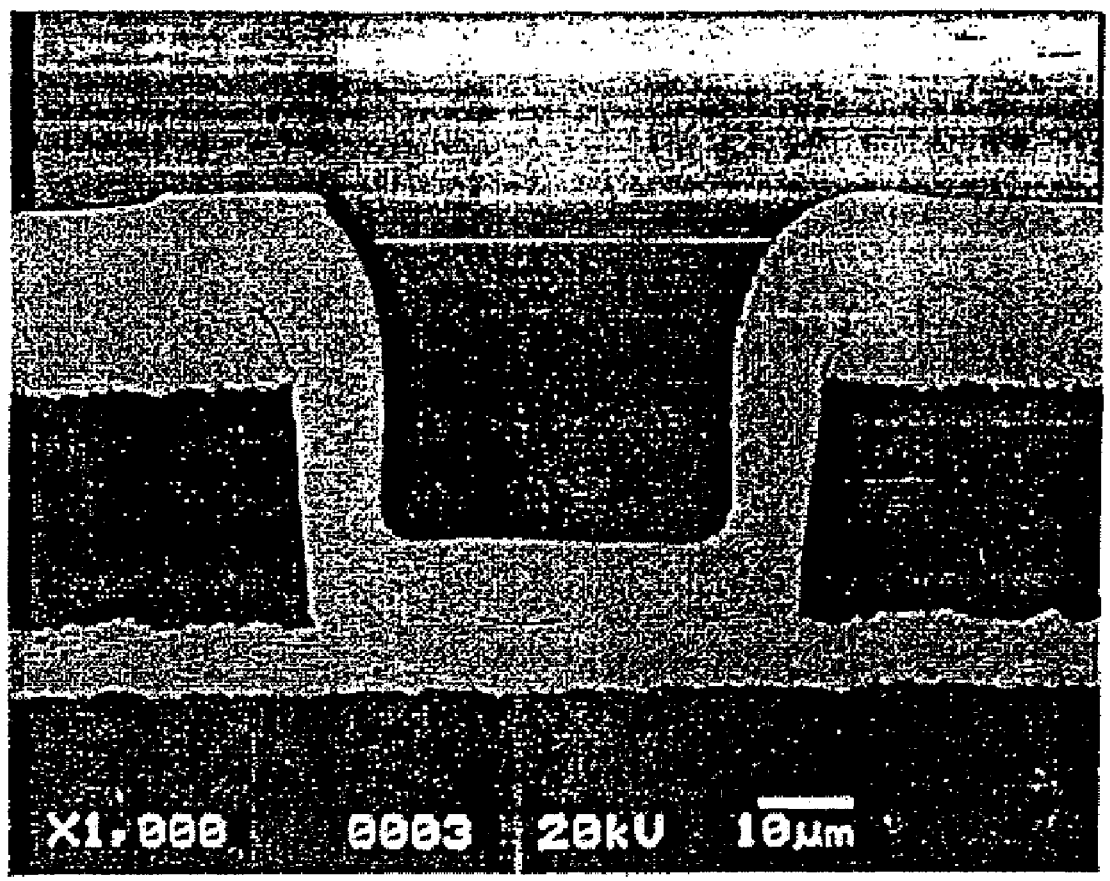

PRODUCTION OF VIA HOLE IN A FLEXIBLE PRINTED CIRCUIT BOARD BY APPLYING A LASER OR PUNCH

FIELD OF INVENTION

The present invention relates to a process for producing a via hole in a flexible circuit (or wiring) printable board and further relates to a process for producing a flexible circuit (or wiring) printed board.

BACKGROUND OF INVENTION

Recently, sequential build-up boards have been developed in order to package various electronic elements with high density. The sequential build-up boards are made of a plurality of circuit printed boards placed one on another. The circuit printed board is produced by producing electroconductive via holes such as blind holes or through holes in a circuit board having on each surface side a predetermined circuit pattern.

The blind holes are produced by forming holes in a metal coat of a circuit printable board by etching and then forming holes in an insulating substrate of the circuit printable board by means of a punch, a drill, a carbon dioxide laser, a UV-YAG laser, or an excimer laser.

Japanese Patent Provisional Publication 10-154730 describes a process for producing a blind via hole which comprises the steps of patterning a copper layer of a two layer-CCL (Copper Clad Laminate employing a polyimide film) utilizing a photoresist coat placed on the copper layer; removing the polyimide film in the patterned area by $CO_2$ laser to form a blind hole; desmearing a polyimide resin deposited in the bottom of the blind hole; removing a portion of the copper layer and a small amount of polyimide resin by means of etching and desmearing; making the blind hole electroconductive by copper-plating to convert a blind via hole.

In the production of via holes, metal flashes are generally generated. The metal flashes are then removed by buffing or dry-blasting. The desmear (clearing the inside of the via hole) is performed by a wet desmear method using an aqueous alkaline manganese salt solution.

The buffing inadvertently causes elongation in the machine direction and then brings about anisotropic dimensional variation of the metal/polyimide film composite film. The polyimide wall in the via hole should be cleaned by an additional desmear procedure. The dry blasting may produce dusts in the blasting procedure. Therefore, the dry blasting is not advantageously employed in a clean room. Moreover, abrasive grains attached to the metal/polyimide film composite in the course of the blasting procedure disturbs adhesion of a photoresist in the following photolithographic procedure. The wet desmear is carried out under heating in a strong alkaline solution. Therefore, the polyimide film is likely damaged and cracks may be produced in the polyimide film.

DISCLOSURE OF INVENTION

It is an object of the present invention to provide an improved process for producing a via hole in a flexible circuit (or wiring) printable board.

It is another object of the invention to provide an improved process for producing a flexible circuit (or wiring) printed board.

The present invention resides in a process for producing a flexible circuit printable board which comprises the steps of:

forming in a polyimide film having a metal coat on each surface side a via hole penetrating at least one metal coat and the polyimide film; and applying a mixture of liquid and abrasive grains under pressure onto the via hole, whereby smoothing an edge of the via hole and cleaning (namely, desmearing) the via hole.

The application of a mixture of liquid and abrasive grains under pressure can be named "wet blasting". The smoothing the edge of the via hole can be done by removing flashes of the metal film which are produced in the via-producing procedure. In the course of the clearing of the via hole, polyimide flashes are mainly removed from the via hole.

In the above-mentioned process, the following embodiments are preferably employed:

(1) The via hole is a blind hole, namely, a hole whose one side is covered by one metal film, formed by means of a laser such as a carbon dioxide laser, a UV-YAG laser, or an excimer laser.

(2) The via hole is a through-hole formed by means of a punch and a drill.

(3) The polyimide film having a metal coat on each surface side is produced by placing a metal film on each surface side of a multilayer polyimide film having on each side a thermoplastic polyimide layer.

(4) The metal coat has a terminal which is plated with gold or thin.

(5) A ratio of a diameter of the blind hole in the metal film on the side to which the laser has been applied against a diameter of the blind hole in the polyimide film on the side facing the metal film having the hole is in the range of 1.0 to 1.4.

(6) A mean diameter of the blind hole is in the range of 30 to 200 μm.

(7) The blind hole which is continuously formed in one metal film and the polyimide film has a depth in the range of 20 to 110 μm.

(8) The thickness of the metal film is in the range of 1 to 50 μm.

(9) A ratio of the thickness of the metal film to which the laser is applied against the thickness of the metal film on the opposite side is in the range of 0.02 to 1.0.

(10) The polyimide film has a three layer structure in which a polyimide layer on one surface side and a polyimide layer on another surface side have the same linear expansion coefficient.

(11) The flexible circuit printable board has a sprocket hole on both edges.

(12) The flexible circuit printable board has via holes in numbers of 1 to 1,000/100 $mm^2$.

The invention further resides in a process for producing a flexible circuit printed board which comprises the steps of:

forming in a polyimide film having a metal coat on each surface side a via hole penetrating at least one metal coat and the polyimide film;

applying a mixture of liquid and abrasive grains under pressure onto the via hole, whereby smoothing an edge of the via hole and cleaning the via hole;

plating an inside of the via hole with metal so as to electrically connect the metal coat on one surface side to the metal coat on another surface side; and etching each of the metal coat to form a predetermined circuit pattern.

In the above-mentioned process, the following embodiments are preferably employed:

(1) The process further comprises a step of forming a solder mask on the circuit pattern.

(2) The process furthermore comprises a step of forming an opening on the solder mask and a step of plating a gold layer on the metal layer in the opening.

(3) The solder mask is formed by laminating on the circuit pattern a photosensitive resist film under vacuum and subjecting the laminated resist film to predetermined patterning.

BRIEF DESCRIPTION OF DRAWINGS

FIG. 5 is a photograph showing a section of the copper-plated via hole of the flexible printable circuit board produced in Comparison Example 1.

DETAILED DESCRIPTION OF INVENTION

Figure 1:
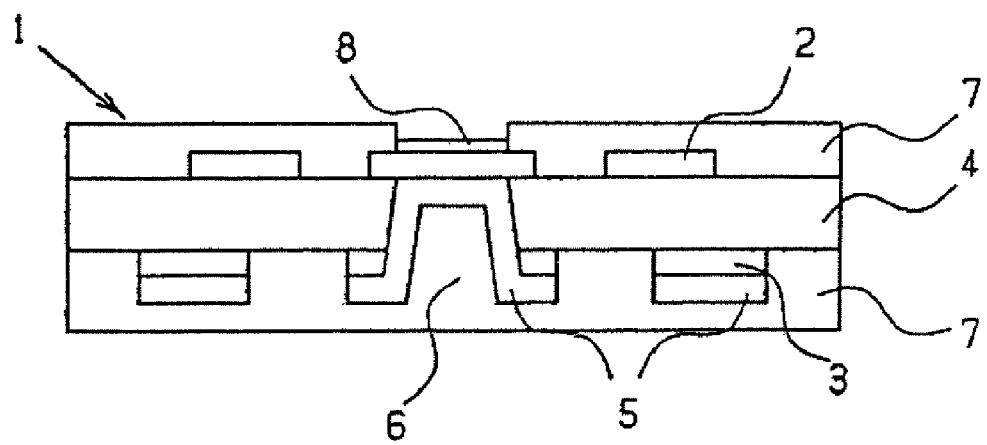
FIG. 1 is a flexible circuit printed board produced by the process of the invention.

The present invention is further described by referring to FIG. 1.

A flexible circuit printed board 1 of the invention is prepared by the following steps:

(1) a step of forming in a polyimide film 4 having a metal coat 2, 3 on each surface side a via hole 6 penetrating at least one metal coat 3 and the polyimide film 4; which is formed by applying a laser to the polyimide film 4 or by punching the polyimide 4

(2) a step of applying a mixture of liquid and abrasive grains under pressure onto the via hole 6, whereby smoothing an edge of the via hole and cleaning the via hole;

(3) a step of forming a plated metal layer 5 in the via hole with metal so as to electrically connect the metal coat 2 on one surface side to the metal coat 3 on another surface side; and (4) a step of etching each of the metal coat 2, 3 to form a predetermined circuit pattern.

If desired, a solder mask 7 is further formed on the circuit pattern. On the solder mask 7 is formed an opening, and a gold layer 8 is then plated in the opening.

The solder mask is preferably formed by laminating on the circuit pattern a photosensitive resist film under vacuum and subjecting the laminated resist film to predetermined patterning.

The metal coat on the polyimide film is a metal foil or film comprising copper, aluminum, iron, gold, or one of their alloys. The metal coat preferably is made of a rolled copper foil, an electrolytic copper foil, a deposited copper film and/or a plated copper film. The copper foil preferably has a moderate roughness of 3 μm or less in terms of Rz, more preferably in the range of 0.3 to 3 μm, most preferably in the range of 1.5 to 3 μm. Copper foils having such roughness are commercially available by the trade names of VLP, LP (or HTE). The metal coat preferably has a thickness of 1 to 12 μm, more preferably 2 to 9 μm. A metal coat having a large thickness is not appropriate for fine-patterning. A metal foil having a small Rz can be employed after surface treatment.

The polyimide film can be a heat resistant, flexible single layer polyimide film having a glass transition temperature in the range of 275 to 375° C. It is preferred, however, that a three layer polyimide composite film having a core polyimide film having a glass transition temperature of 300° C. or higher and a pair of thermoplastic and/or flexible polyimide surface layers having a glass transition temperature of 200 to 300° C. The three layer polyimide composite film preferably has a thickness of 7 to 50 μm and an elastic modulus in tension in the range 400 to 1,000 kgf/mm$^2$ (at 25° C.).

The polyimide film having a metal coat on each surface side is preferably manufactured by pressing a three layer polyimide composite film between a pair of metal foils under heating, for instance, by means of a double belt press. Otherwise, a metal is vapor deposited on both surfaces of the single polyimide film or the three layer polyimide composite film and then on the deposited metal layer is placed a copper layer by electrolytic plating (i.e., metal vapor deposition-electrolytic copper plating process). In this process, the polyimide film is preferably subjected to vacuum discharge treatment so as to produce a chain of protrusions in the form of a network on the film surface before the vapor deposition is made. The discharge treated polyimide film is then cleaned by plasma cleaning directly or after it is once placed under atmospheric conditions. On the cleaned polyimide film surface, at least two vapor-deposited metal layers are preferably formed, and subsequently copper metal-plating is performed on the metal deposited layers.

The above-mentioned metal vapor deposition-electrolytic copper plating process can be carried out utilizing various combinations of metals. The metal deposited film is preferably made of two deposited layers, namely, a subbing layer and a surface layer. The subbing layer can be made of chromium, titanium, palladium, zinc, molybdenum, nickel, cobalt, zirconium, iron, nickel-copper alloy, nickel-gold alloy, or nickel-molybdenum alloy. The surface layer (or an intermediate layer) can be made of copper. The metal plated layer which is formed on the metal deposited layer is preferably made of copper, copper alloy, or silver. Copper is most appropriate. The copper plated layer can be formed by electroless plating, so as to cover pin-holes. The metal deposited layer can have a large thickness such as 0.1 to 1.0 μm, and an electrolytic plated copper can be directly placed on the thick deposited layer.

The copper electrolytic plating can be preferably carried out in an aqueous bath containing 50 to 200 g/L of copper sulfate, 100 to 250 g/L of sulfuric acid, and a small amount of a brightener (preferably further an appropriate amount of chlorine) under the conditions of a temperature of 15 to 45° C., an electric current density of 0.1 to 10 A (ampere)/dm$^2$, air agitation, transfer rate of 0.1 to 2 m/min., and the use of copper negative electrode.

In the process of the invention, a via hole is produced in at least one metal coat and the polyimide film. The via hole can be produced by means of a punch, a drill, a carbon dioxide laser, a UV-YAG laser, or an excimer laser. The use of a punch or UV-YAG laser is preferred. The UV-YAG laser can emit a laser in the UV region (oscillation wavelength region of 260 to 400 nm). The layer can be applied on one metal coat of the metal coat polyimide film to produce a via hole having a diameter of 20 to 200 μm, preferably approx. 30 to 100 μm. The laser is simultaneously applied to the polyimide film layer after de-focusing to produce in the polyimide film a hole of the same diameter.

In the course of production of the via hole, flashes of metal are produced around the via hole, and metal flashes are deposited in the via hole. Further, polyimide dust is deposited in the via hole. These flashes and dust are cleaned by a wet-blasting which is performed by applying a mixture of liquid and abrasive grains under pressure onto the via hole.

The wet-blasting can be carried out by placing the metal-coated polyimide film on a blasting apparatus having a magnetic element and then placing a metal mask having a predetermined opening closely on the metal-coated polyimide film by the use of magnetic power. The metal mask preferably has on its bottom surface an elastic layer such as urethane rubber layer so as not to damage the metal coat on the polyimide film. An example of such wet-blasting apparatus is described in Japanese Patent Provisional Publication No. 9-295266.

The mixture for the wet-blasting preferably comprises water and 5 to 20 vol. % of abrasive grains (such as alumina grains) having a diameter of 1 to 10 μm. The mixture was applied under high pressure onto the via hole at a flow rate of approx. 10 to 300 m/sec.

The via hole having been subjected to the wet-blasting procedure is then plated with metal so as to connect a metal coat on one surface side to a metal coat on another surface side. The metal plating in the via hole can be carried out in the manner described in Japanese Patent Provisional Publication No. 11-51425.

For instance, the inner wall of the via hole is activated by forming Pd—Sn film and then plated with metal preferably by electrolytic copper plating. The Pd—Sn film is produced by use of a palladium-tin colloidal catalyst and activated by immersing the Pd—Sn film in an alkali accelerator bath containing a reducing agent. This procedure is generally carried out in DPS (Direct Plating System).

In more detail, the DPS is carried out by the following steps. The via hole is washed with monoethanol amine, a nonionic surfactant, a cationic surfactant, and the like to defat the metal and polyimide areas of the via hole, desmeared using an alkaline permanganate solution, soft-etched using a sodium persulfate solution, and then pre-dipped in a mixture of sodium chloride and hydrochloric acid. After these steps are complete, the treated via hole is immersed in a palladium-tin colloidal solution to form a Pd—Sn film which is then activated in an alkaline accelerator bath containing sodium carbonate, potassium carbonate, copper ion and a reducing agent, and further in an acidic accelerator bath containing sulfuric acid. Examples of the reducing agents include aldehydes such as formaldehyde, acetaldehyde, propionaldehyde, and benzaldehyde, catechol, resorcinol and ascorbic acid.

The above-mentioned activating procedure, the inner wall of the via hole is coated with a low electric resistant Pd—Sn film, and the following copper plating procedure can be carried out within a shorter period of time.

The via hole is then washed with an acid and electrolytically plated with copper. The electrolytic plating is preferably carried out in a bath containing 180-240 g/L of copper sulfate, 45-60 g/L of sulfuric acid, 20-80 g/L of chloride ion, and additives such as thiourea, dextrin, or a combination of thiourea and molasses at an electric current density of 2 to 8 A/dm$^2$. Thus, a copper plated layer having a thickness of 3 to 30 μm is formed on the wall of the via hole (or through-hole).

Subsequently, a ground wiring layer having a predetermined pattern is formed on a metal coat on one surface side by a combination of photo-processing and etching. Further, a signal wiring layer having a predetermined pattern is formed on a metal coat on another surface side by a combination of photo-processing and etching.

On both surfaces or at least on the surface of the ground wiring layer, a photosensitive solder resist, preferably in the form of a dry photosensitive resist film, is laminated preferably by vacuum laminating. The laminated photosensitive solder resist is then exposed to light to form a solder mask layer having the predetermined pattern on the signal wiring layer and the ground wiring layer.

The photosensitive solder resist can be a photosensitive ink resist, for instance, a photosensitive resin composition of polyimide (precursor) type, preferably a photosensitive resin composition of imidesiloxane type described in Japanese Patent Provisional Publication 2000-212446, and a photosensitive heat-setting resin composition of an epoxy-acrylate type described in Japanese Patent Provisional Publication 2000-109541. Preferred is a photosensitive solder resist of a dry film type.

Particularly, a solder resist which shows an elastic modulus in tension of 100 kgf/mm$^2$ or lower after setting is preferred because it serves as a protective film showing no deformation. Preferred examples of the dry type photosensitive solder resists which can serve as protective film after setting include a dry film solder mask for FPC use (photosensitive resin composition mainly composed of urethane rubber and epoxy acrylate, containing a flame retardant and a polymerization initiator, which shows an elastic modulus in tension of approx. 40 kgf/mm$^2$ after setting) and a dry film of photosensitive resin composition described in Japanese Patent Application 2001-359790 which is composed of epoxy acrylate resin, a reaction product (oligomer) of an asymmetric aromatic tetracarboxylic dianhydride and $\alpha,\omega$-bis(3-aminopropyl)polydimethylsiloxane, an epoxy resin, and a photopolymerization initiator (which shows an elastic modulus in tension of approx. 60 kgf/m after setting). These photosensitive solder resist of dry type is favorably employable in comparison with the previously employed composition of coverlay type from the view-points of resistance to plating, no requirement of blanking, formation of fine pattern, and no exudation of adhesive.

Thereafter, the copper layer within the opening of the solder mask is plated with nickel/gold alloy or tin/gold alloy by a known electrolytic plating procedure. Thus, the desired flexible circuit printed board is produced.

Example 1

A metal-coated composite (trade name Upicel N, available from Ube Industries, Ltd.) composed of a three layer polyimide film (thickness: 25 μm) having a thermoplastic surface on each surface side and an electrolytic copper foil (thickness: 9 μm, trade name USLPR2, available from Nippon Electrolytic Co., Ltd.) which was placed on each of the thermoplastic surfaces under pressure and heating is exposed to a UV-YAG laser (Model 5320 available from ESI, wavelength 355 μm), to form simultaneously holes in one copper layer and in the polyimide film. To the holes were subsequently applied a mixture of water and alumina grains (alumina content: 16 vol. %) under an air pressure of 0.2 MPa using a wet-blasting apparatus (available Mako Co., Ltd.), whereby metal flashes and dust in the holes were removed.

Figure 2:
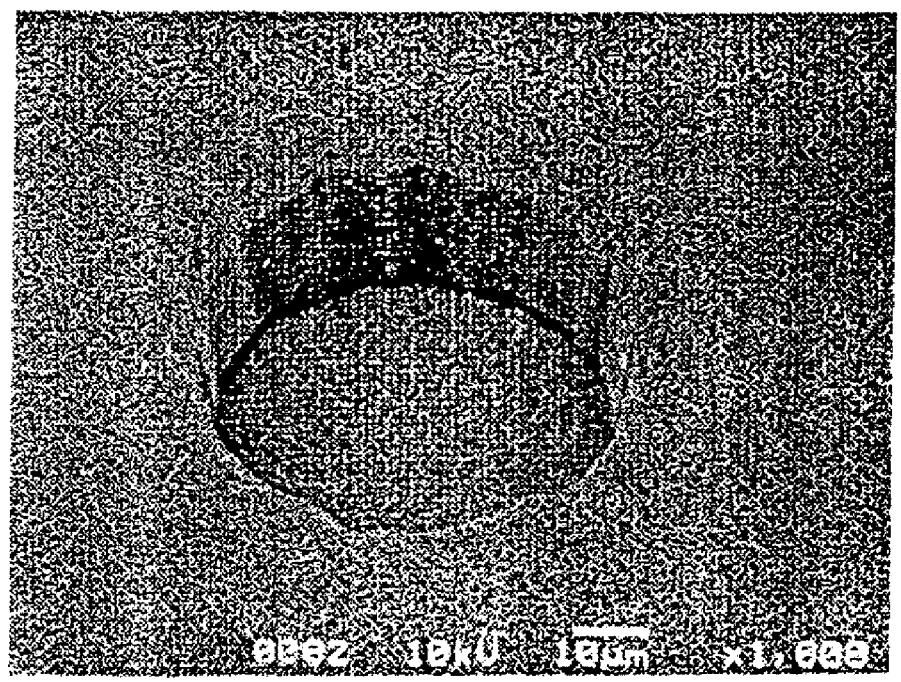
FIG. 2 is a photograph showing a section of the via hole which has been treated by the wet blasting of the invention.

FIG. 2 shows a section of the hole having been subjected to the above-mentioned wet-blasting.

Figure 3:
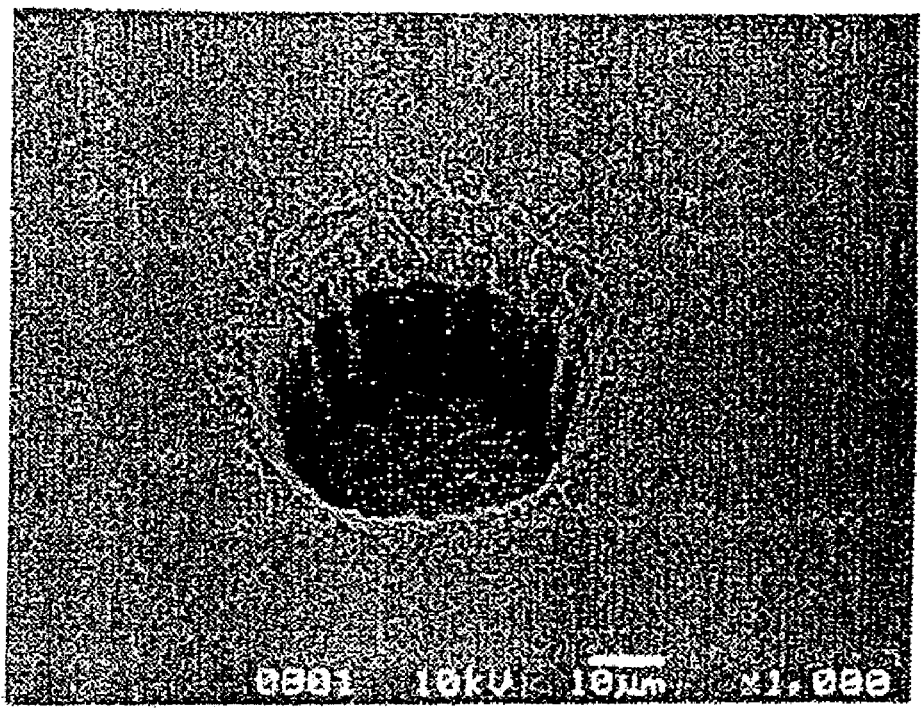
FIG. 3 is a photograph showing a section of the via hole which has not been subjected to the wet blasting.

FIG. 3 shows a section of the hole before having been subjected to the wet-blasting.

The machine and traverse distances of the square area composed of 1,600 holes were measured before and after the wet-blasting. The measured distances are set forth in Table 1. In Table 1, A is the traverse distance and B is the machine distance of the area having been subjected to no wet-blasting, while a is the traverse distance and b is the machine distance of the area having been subjected to wet-blasting.

TABLE 1

| | Before Wet-blasting | | | After Wet-blasting | |
|---|---|---|---|---|---|
| | A | B | | a | b |
| | 22.0399 | 22.0782 | | 22.0591 | 22.0997 |
| | 22.0380 | 22.0821 | | 22.0618 | 22.1026 |
| | 22.0372 | 22.0767 | | 22.0564 | 22.1030 |
| | 22.0395 | 22.0816 | | 22.0584 | 22.0983 |
| Ave. | 22.0387 | 22.0797 | Ave. | 22.0589 | 22.1009 |
| Max-Min. | 0.0027 | 0.0054 | Max-Min. | 0.0054 | 0.0046 |
| | | | | (mm) | |

The differences of distances before and after the wet-blasting are set forth in Table 2.

TABLE 2

| | A - a | B - b |
|---|---|---|
| Average | 0.0203 | 0.0212 |
| Extension (%) | 0.092 | 0.096 |

On the inner walls of the holes were formed electroconductive layers by utilizing Lizatron DPS process of Ebara Uzilight Co., Ltd. On the electroconductive layers and the copper foils were then placed copper layers (thickness: 12 μm) by electrolytic plating.

Figure 4:
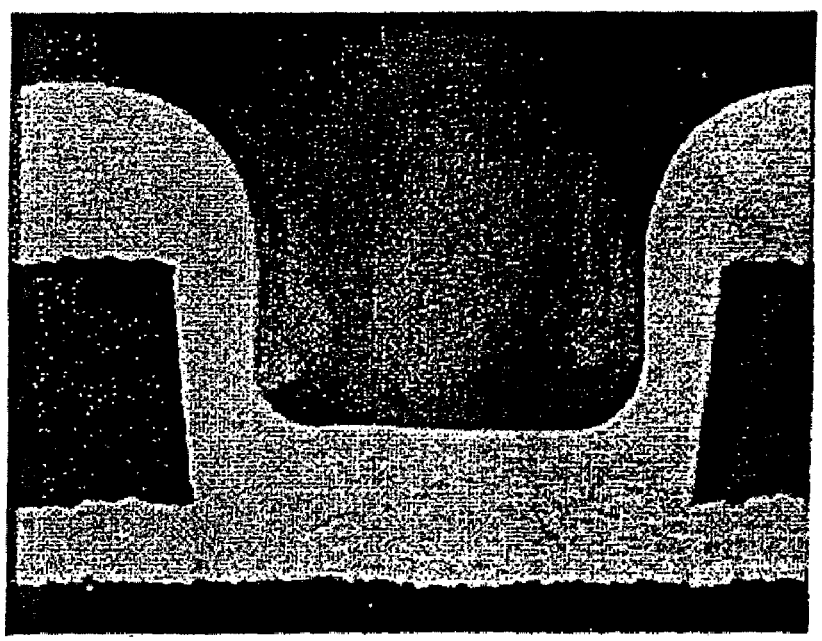
FIG. 4 is a photograph showing a section of the copper-plated via hole of the flexible printable circuit board produced in Example 1.

FIG. 4 shows a section of thus formed via hole having a plated copper layer.

Subsequently, a ground wiring layer having the pre-determined pattern (wiring pitch: 80 μm) was formed on one copper foil layer by photo-processing and etching. On another copper foil layer was then formed a signal wiring layer having the predetermined pattern (wiring pitch: 40 μm) by photo-processing and etching.

Thus, a flexible circuit printed board was produced. In the flexible circuit printed board, the copper foils were firmly connected to the copper plated layer, so that no separation was observed at their interfaces when it was heated.

The results set forth in Tables 1 and 2 indicate that the dimensional difference was not observed between the machine direction and the traverse direction of wet-blasted film. This means that the positioning in the following photo-lithographic process can be easily performed.

The photographs of FIGS. 2, 3 and 4 indicate that the wet-blasted hole has smooth edge and has almost no metal flashes and polyimide dusts.

Comparison Example 1

The procedures of Example 1 were repeated except for omitting the wet-blasting, to give via holes and copper foil having thereon a copper plated layer having a thickness of 12 μm.

FIG. 5 shows a section of thus formed via hole having a plated copper layer.

Then, the procedures of Example 1 were repeated to produce a flexible circuit printed board. In the flexible circuit printed board, the copper foils were not satisfactorily connected to the copper plated layer, so that separation was observed at their interfaces when the board was heated.

Example 2

The procedures of Example 1 were repeated except for producing through-holes in the metal-coated polyimide composite film by means of a punch. Thus produced through-holes were then subjected to wet-blasting in the same manner as in Example 1, to give via holes and copper foil having thereon a copper plated layer having a thickness of 12 μm.

Then, the procedures of Example 1 were repeated to produce a flexible circuit printed board. In the flexible circuit printed board, the copper foils were firmly connected to the copper plated layer, so that no separation was observed at their interfaces when it was heated.

INDUSTRIAL UTILITY

The present invention provides an improved process for producing a via hole in a flexible circuit (or wiring) printable board, and further provides an improved process for producing a flexible circuit (or wiring) printed board.

What is claimed is:

1. A process for producing a flexible circuit printable board which comprises the steps of:
   applying a laser to a polyimide film having a metal coat on each surface side or punching a polyimide film having a metal coat on each surface side, whereby forming in the polyimide film having a metal coat on each surface side a via hole penetrating at least one metal coat and the polyimide film, resulting in production of flashes of metal on the metal coat at an edge of the formed via hole; and
   applying a mixture of water and abrasive grains having a diameter of 1 to 10 μm under pressure onto the via hole, whereby removing the flashes of metal from the edge of the via hole and cleaning the via hole.

2. The process of claim 1, wherein the flashes of metal are also produced around the via hole.

3. The process of claim 1, wherein the via hole is a blind via hole.

4. A process for producing a flexible circuit printed board which comprises the steps of:
   applying a laser to a polyimide film having a metal coat on each surface side or punching a polyimide film having a metal coat on each surface side, whereby forming in the polyimide film having a metal coat on each surface side a via hole penetrating at least one metal coat and the polyimide film, resulting in production of flashes of metal on the metal coat at an edge of the formed via hole;
   applying a mixture of water and abrasive grains having a diameter of 1 to 10 μm under pressure onto the via hole, whereby removing the flashes of metal from the edge of the via hole and cleaning the via hole;
   plating an inside of the via hole with metal so as to electrically connect the metal coat on one surface side to the metal coat on another surface side; and
   etching each of the metal coat to form a predetermined circuit pattern.

5. The process of claim 4, wherein the flashes of metal are also produced around the via hole.

6. The process of claim 4, wherein the via hole is a blind via hole.

* * * * *